United States Patent [19]

Trottier

[11] Patent Number: 4,802,170

[45] Date of Patent: Jan. 31, 1989

[54] ERROR DISBURSING FORMAT FOR DIGITAL INFORMATION AND METHOD FOR ORGANIZING SAME

[75] Inventor: Lorne Trottier, Dorval, Canada

[73] Assignee: Matrox Electronics Systems Limited, Quevec, Canada

[21] Appl. No.: 43,939

[22] Filed: Apr. 29, 1987

[51] Int. Cl.⁴ .............................................. G06F 11/10
[52] U.S. Cl. ............................................ 371/40; 371/2
[58] Field of Search ..................... 371/37, 38, 39, 40, 371/2; 360/32, 38.1; 358/336, 327

[56] References Cited

U.S. PATENT DOCUMENTS 4,393,414 7/1983 Reitmeier .................... 360/38.1 X
4,425,644 1/1984 Scholz ............................. 371/40
4,441,184 4/1984 Sonoda ......................... 371/38 X Primary Examiner—Jerry Smith
Assistant Examiner—Robert W. Beausoliel
Attorney, Agent, or Firm—Louis E. Marn

[57] ABSTRACT

Multiple stage interleaving through a memory matrix is utilized to separate adjacently disposed bits from bytes of digital information, in a reorganized bit stream. At least two stages of interleaving are required for the preferred embodiments of the invention which achieves a bit separation distance equal to the bit capacity of a plurality of either the matrix columns or rows, with that plurality being the number of adjacently disposed bits in each byte of digital information.

12 Claims, 5 Drawing Sheets

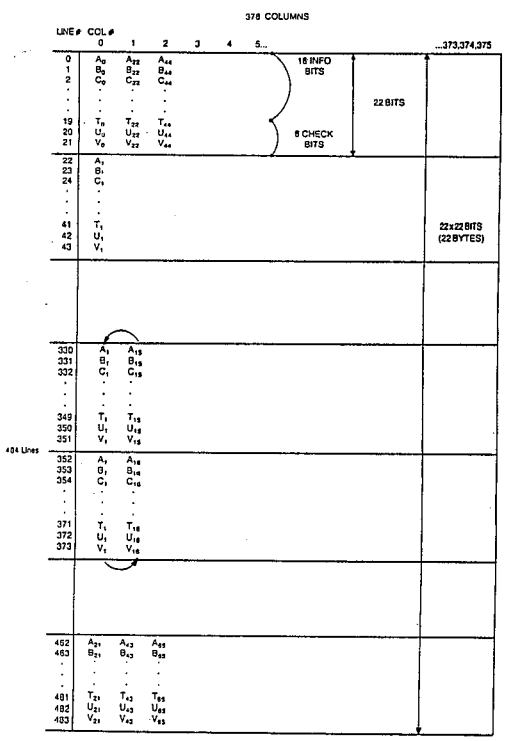

376 COLUMNS

| LINE # | COL # 0 | 1 | 2 | 3 | 4 | 5... | | | ...373,374,375 |
|---|---|---|---|---|---|---|---|---|---|
| 0 | $A_0$ | $A_{22}$ | $A_{44}$ | | | | 16 INFO BITS | 22 BITS | |
| 1 | $B_0$ | $B_{22}$ | $B_{44}$ | | | | | | |
| 2 | $C_0$ | $C_{22}$ | $C_{44}$ | | | | | | |
| . | . | . | . | | | | | | |
| 19 | $T_0$ | $T_{22}$ | $T_{44}$ | | | | | | |
| 20 | $U_0$ | $U_{22}$ | $U_{44}$ | | | | 6 CHECK BITS | | |
| 21 | $V_0$ | $V_{22}$ | $V_{44}$ | | | | | | |
| 22 | $A_1$ | | | | | | | | |
| 23 | $B_1$ | | | | | | | | |
| 24 | $C_1$ | | | | | | | | |
| . | . | | | | | | | | |
| 41 | $T_1$ | | | | | | | | 22×22 BITS (22 BYTES) |
| 42 | $U_1$ | | | | | | | | |
| 43 | $V_1$ | | | | | | | | |
| 330 | $A_1$ | $A_{15}$ | | | | | | | |
| 331 | $B_1$ | $B_{15}$ | | | | | | | |
| 332 | $C_1$ | $C_{15}$ | | | | | | | |
| . | . | . | | | | | | | |
| 349 | $T_1$ | $T_{15}$ | | | | | | | |
| 350 | $U_1$ | $U_{15}$ | | | | | | | |
| 351 | $V_1$ | $V_{15}$ | | | | | | | |
| 352 | $A_1$ | $A_{16}$ | | | | | | | |
| 353 | $B_1$ | $B_{16}$ | | | | | | | |
| 354 | $C_1$ | $C_{16}$ | | | | | | | |
| . | . | . | | | | | | | |
| 371 | $T_1$ | $T_{16}$ | | | | | | | |
| 372 | $U_1$ | $U_{16}$ | | | | | | | |
| 373 | $V_1$ | $V_{16}$ | | | | | | | |
| 462 | $A_{21}$ | $A_{43}$ | $A_{65}$ | | | | | | |
| 463 | $B_{21}$ | $B_{43}$ | $B_{65}$ | | | | | | |
| . | . | . | . | | | | | | |
| 481 | $T_{21}$ | $T_{43}$ | $T_{65}$ | | | | | | |
| 482 | $U_{21}$ | $U_{43}$ | $U_{65}$ | | | | | | |
| 483 | $V_{21}$ | $V_{43}$ | $V_{65}$ | | | | | | |

484 Lines

FIG. 1

376 COLUMNS

| LINE # | COL # 0 | 1 | 2 | 3 | 4 | 5... | | ...373,374,375 |
|---|---|---|---|---|---|---|---|---|
| 0 | $A_0$ | $A_{22}$ | $A_{44}$ | | | | | |
| 1 | $A_1$ | $A_{23}$ | $A_{45}$ | | | | | |
| 2 | $C_0$ | $C_{22}$ | $C_{46}$ | | | | 22 BITS | |
| . | . | . | . | | | | | |
| 19 | $A_{19}$ | $A_{41}$ | $A_{63}$ | | | | | |
| 20 | $A_{20}$ | $A_{42}$ | $A_{64}$ | | | | | |
| 21 | $A_{21}$ | $A_{43}$ | $A_{65}$ | | | | | |
| 22 | $B_0$ | | | | | | | |
| 23 | $B_1$ | | | | | | | |
| 24 | $B_2$ | | | | | | | |
| . | . | | | | | | | 22 x 22 BITS |
| 41 | $B_{19}$ | | | | | | | (22 COMPOSITE BYTES) |
| 42 | $B_{20}$ | | | | | | | |
| 43 | $B_{21}$ | | | | | | | |
| 330 | $O_0$ | $P_0$ | | | | | | |
| 331 | $O_1$ | $P_1$ | | | | | | |
| 332 | $O_2$ | $P_2$ | | | | | | |
| . | . | . | | | | | | |
| 349 | $O_{19}$ | $P_{19}$ | | | | | | |
| 350 | $O_{20}$ | $P_{20}$ | | | | | | |
| 351 | $O_{21}$ | $P_{21}$ | | | | | | |
| 352 | $P_0$ | $Q_0$ | | | | | | |
| 353 | $P_1$ | $Q_1$ | | | | | | |
| 354 | $P_2$ | $Q_2$ | | | | | | |
| . | . | . | | | | | | |
| 371 | $P_{19}$ | $Q_{19}$ | | | | | | |
| 372 | $P_{20}$ | $Q_{20}$ | | | | | | |
| 373 | $P_{21}$ | $Q_{21}$ | | | | | | |
| 462 | $V_0$ | $V_{22}$ | $V_{44}$ | | | | | |
| 463 | $V_1$ | $V_{23}$ | $V_{45}$ | | | | | |
| . | . | . | . | | | | | |
| 481 | $V_{19}$ | $V_{41}$ | $V_{63}$ | | | | | |
| 482 | $V_{20}$ | $V_{42}$ | $V_{64}$ | | | | | |
| 483 | $V_{21}$ | $V_{43}$ | $V_{65}$ | | | | | |

484 Lines

FIG. 2

| LINE # | COL # | | | | | | | | |
|---|---|---|---|---|---|---|---|---|---|
| | 0 | 1 | 2 | 3 | 4 | 5... | | | ...373,374,375 |
| 0 | $A_0$ | $A_{16}$ | $A_{32}$ | | | | 16 INFO BITS | | |
| 1 | $B_0$ | $B_{16}$ | $B_{32}$ | | | | | 22 BITS | |
| 2 | $C_0$ | $C_{16}$ | $C_{32}$ | | | | | | |
| . | . | . | . | | | | | | |
| . | . | . | . | | | | | | |
| . | . | . | . | | | | | | |
| 19 | $T_0$ | $T_{16}$ | $T_{32}$ | | | | | | |
| 20 | $U_0$ | $U_{16}$ | $U_{32}$ | | | | 6 CHECK BITS | | |
| 21 | $V_0$ | $V_{16}$ | $V_{32}$ | | | | | | |
| 22 | $A_1$ | | | | | | | | |
| 23 | $B_1$ | | | | | | | | |
| 24 | $C_1$ | | | | | | | | |
| . | . | | | | | | | | |
| . | . | | | | | | | | 16 x 22 BITS |
| 41 | $T_1$ | | | | | | | | (16 BYTES) |
| 42 | $U_1$ | | | | | | | | |
| 43 | $V_1$ | | | | | | | | |
| 330 | $A_{15}$ | $A_{31}$ | $A_{47}$ | | | | | | |
| 331 | $B_{15}$ | $B_{31}$ | $B_{47}$ | | | | | | |
| 332 | $C_{15}$ | $C_{31}$ | $C_{47}$ | | | | | | |
| . | . | . | . | | | | | | |
| 349 | $T_{15}$ | $T_{31}$ | $T_{47}$ | | | | | | |
| 350 | $U_{15}$ | $U_{31}$ | $U_{47}$ | | | | | | |
| 351 | $V_{15}$ | $V_{31}$ | $V_{47}$ | | | | | | |
| 352 | | | | | | | | | |
| 353 | | | | | | | | | |
| 354 | | | | | | | | | |
| . | | | | | | | | | |
| 371 | | | | | | | | | |
| 372 | | | | | | | | | |
| 373 | | | | | | | | | |
| | | | | | | | | | 6 x 22 BITS (6 EMPTY BYTES) |
| 462 | | | | | | | | | |
| 463 | | | | | | | | | |
| . | | | | | | | | | |
| 481 | | | | | | | | | |
| 482 | | | | | | | | | |
| 483 | | | | | | | | | |

376 COLUMNS

484 Lines

FIG. 3

376 COLUMNS

| LINE # | COL # 0 | 1 | 2 | 3 | 4 | 5... | | ...373,374,375 |
|---|---|---|---|---|---|---|---|---|
| 0 | $A_0$ | $A_{16}$ | $A_{32}$ | | | | BIT 16 POSITION COMPOSITE BYTE | |
| 15 | $A_{15}$ | $A_{31}$ | $A_{47}$ | | | | | 22 BITS |
| 16 | $CB_1$ | $CB_1$ | $CB_1$ | | | | 6-CHECK BITS | |
| 21 | $CB_6$ | $CB_6$ | $CB_6$ | | | | | |
| 22 | $B_0$ | | | | | | | |
| 37 | $B_{15}$ | | | | | | | 22 × 22 BITS (22 EXPANDED COMPOSITION BYTES) |
| 38 | $CB_1$ | | | | | | | |
| 43 | $CB_6$ | | | | | | | |
| 330 | $O_0$ | $P_0$ | | | | | | |
| 345 | $O_{15}$ | $P_{15}$ | | | | | | |
| 346 | $CB_1$ | | | | | | | |
| 351 | $CB_6$ | | | | | | | |
| 352 | $P_0$ | $Q_0$ | | | | | | |
| 367 | $P_{15}$ | $Q_{15}$ | | | | | | |
| 368 | $CB_1$ | | | | | | | |
| 373 | $CB_0$ | | | | | | | |
| 462 | $V_0$ | $V_{16}$ | $V_{32}$ | | | | | |
| 477 | $V_{15}$ | $V_{31}$ | $V_{47}$ | | | | | |
| 478 | $CB_1$ | $CB_1$ | $CB_1$ | | | | | |
| 483 | $CB_6$ | $CB_6$ | $CB_6$ | | | | | |

484 Lines

| LINE # | COL # 0 | 1 | 2 | 3 | 4 | 5... | | | ...373,374,375 |
|---|---|---|---|---|---|---|---|---|---|
| | | | | 376 COLUMNS | | | | | |
| 0 | $B_0$ | $B_{16}$ | $B_{32}$ | | | | 16 INFO BITS | 22 BITS | |
| 1 | $C_0$ | $C_{16}$ | $C_{32}$ | | | | | | |
| 2 | $D_0$ | $D_{16}$ | $D_{32}$ | | | | | | |
| . | . | . | . | | | | | | |
| 19 | $U_0$ | $U_{16}$ | $U_{32}$ | | | | | | |
| 20 | $V_0$ | $V_{16}$ | $V_{32}$ | | | | 6 CHECK BITS | | |
| 21 | $A_0$ | $A_{16}$ | $A_{32}$ | | | | | | |
| 22 | $B_1$ | | | | | | | | |
| 23 | $C_1$ | | | | | | | | |
| 24 | $D_1$ | | | | | | | | |
| . | . | | | | | | | | |
| 41 | $U_1$ | | | | | | | | 16 x 22 BITS (16 BYTES) |
| 42 | $V_1$ | | | | | | | | |
| 43 | $A_1$ | | | | | | | | |
| 330 | $B_{15}$ | $B_{31}$ | $B_{47}$ | | | | | | |
| 331 | $C_{15}$ | $C_{31}$ | $C_{47}$ | | | | | | |
| 332 | $D_{15}$ | $D_{31}$ | $D_{47}$ | | | | | | |
| . | . | . | . | | | | | | |
| 349 | $U_{15}$ | $U_{31}$ | $U_{47}$ | | | | | | |
| 350 | $V_{15}$ | $V_{31}$ | $V_{47}$ | | | | | | |
| 351 | $A_{15}$ | $A_{31}$ | $A_{47}$ | | | | | | |
| 352 | $CB_{1B}$ | $CB_{1B}$ | $CB_{1B}$ | | | | | | |
| 353 | $CB_{1C}$ | $CB_{1C}$ | . | | | | | | |
| 354 | $CB_{1D}$ | . | . | | | | | | |
| . | . | . | . | | | | | | |
| 371 | $CB_{1U}$ | . | . | | | | | | |
| 372 | $CB_{1V}$ | . | . | | | | | | |
| 373 | $CB_{1A}$ | $CB_{1A}$ | $CB_{1A}$ | | | | | | 6 x 22 BITS (CHECK BITS FOR 22 COMPOSITE BYTES OF 16 BITS) |
| 462 | $CB_{6B}$ | $CB_{6B}$ | $CB_{6D}$ | | | | | | |
| 463 | $CB_{6C}$ | $CB_{6C}$ | . | | | | | | |
| . | . | . | . | | | | | | |
| 481 | $CB_{6U}$ | . | . | | | | | | |
| 482 | $CB_{6V}$ | $CB_{6V}$ | . | | | | | | |
| 483 | $CB_{6A}$ | $CB_{6A}$ | $CB_{6A}$ | | | | | | |

484 Lines

ERROR DISBURSING FORMAT FOR DIGITAL INFORMATION AND METHOD FOR ORGANIZING SAME

BACKGROUND OF THE INVENTION

(1) Field of the Invention

The present invention relates to a method for disbursing information into a memory matrix, and more particularly to a method for multiple stage matrix interleaving of a digital information bit stream.

(2) Description of the Prior Art

Because of their huge storage capacity and relatively low cost, laser optical discs are being adapted for many new high density digital information storage applications. By comparison, a laser optical disc has the storage capacity of 12,500,000 million characters, whereas a hard magnetic disc has the storage capacity of 2.5 million characters. Laser optical discs have been utilized for some time as the information storage medium in home video replay systems priced within the means of many consumers. Although the video signal recorded in such systems is analog, interactive video disc systems have been developed which record digital information on the laser optical disc along with video information, such as computer programs, textual computer files, audio, and the like.

However, one difficulty with laser optical discs is that frequent burst errors or dropouts are encountered therewith, which severely affect the integrity of any information recorded thereon. Although such dropouts are a problem in regard to the integrity of analog information, such as video in the previously mentioned replay systems, it presents a much greater problem in regard to digital information. Furthermore, this difficulty is compounded in the replication process presently utilized for the laser optical discs that are distributed with video and audio recorded thereon for playback by such replay systems. In this replication process, the information to be recorded is organized or formatted in a video tape recorder (VTR) from which it is passed for recording on the laser optical disc.

As is true for any magnetic recording medium, the tape of the VTR is also the cause of frequent dropouts which are actually a gap or void in the information and are usually caused by a defect on the magnetic medium. One example of such a defect is the stipples or bumps of magnetic oxide which occur periodically on a magnetic recording medium. The stipples cause the record and/or replay transducer head to bounce or jump off the magnetic medium and thereby result in information gaps during the time that the transducer head is displaced from the magnetic medium. In regard to digital information, such gaps obliterate two or more successive bits of information, which is the criteria that distinguishes burst error or dropout from single bit or random error.

Although various error correction codes have been utilized in regard to digital information to effectively cope with dropout, such codes tend to be complex and such complexity increases in proportion to the level of integrity desired for the information. Of course, the greater the complexity of the error correction code, the greater the number of check bits that must be disposed in each byte of information, and the greater the complexity and cost of the hardware associated with such error correction. Furthermore, both the operational response time of such hardware and the information storage capacity of the recording medium are decreased proportionally, as the number of check bits per byte of information is increased.

To enhance the effectiveness of less complex error correction codes, single stage interleaving has been utilized to reduce the effect of dropout, such as disclosed in U.S. Pat. No. 4,217,660 to En. With such interleaving, consecutive bytes of digital information are first written into a matrix, row by row or column by column. Then a bit stream is read out from the matrix, column by column or row by row, respectively, with the bits which were adjacently disposed previously in each byte of digital information separated therein by the distance of either one column or one row of bits. Due to such separation, when such bit stream is recorded, more than one bit in any byte of digital information is less likely to be affected by dropout and error correction is therefore simplified. Furthermore, the possibility that more than one bit in any byte of digital information will be affected by both dropout and random error is greatly reduced. Consequently, such interleaving permits error correction codes of relatively minor complexity to be used, such as the Hamming Code which, for any byte of digital information, will only correct a single bit error and detect double bit errors (error affecting two bits in a sequence).

In other single stage matrix interleaving, more sophisticated error correction codes are utilized and are added to the digital information after entry thereof into the matrix, such as disclosed in U.S. Pat. No. 4,495,623 to George et al.

OBJECTS OF THE INVENTION

It is a general object of the present invention to enhance the integrity of recorded information, particularly digital information that is error corrected with a relatively simple code, through the use of multiple stage interleaving.

It is a specific object of the present invention to enhance the integrity of recorded information in accordance with the previously recited general object, while also expanding the capability of error correction codes through multiple stage application thereof during multiple stage interleaving.

SUMMARY OF THE INVENTION

These and other objects of the present invention are accomplished by multiple passes of the information through a matrix to interleave a reorganized bit stream from each pass. Composite bytes containing only bits from identical positions in other bytes are derived from at least one of the passes for circulation through the matrix in the next pass. Extended capability of an error correction code is realized by applying that code to bytes in at least two different bit stream formulations of the information.

BRIEF DESCRIPTION OF THE DRAWINGS

A better understanding of the present invention as well as other objects and advantages thereof will become apparent upon consideration of the following detailed disclosure thereof, especially when taken in conjunction with the accompanying drawings, wherein:

FIG. 1 illustrates an entry layout plan of digital information bytes in a matrix for a first interleaving stage of one embodiment of the present invention;

FIG. 2 illustrates an entry layout plan of composite bytes in the matrix for the next interleaving stage of the embodiment of FIG. 3 illustrates an entry layout plan of digital information bytes in a matrix for a first interleaving stage of another the present invention;

FIG. 4 illustrates the entry layout plan of error corrected bytes in the matrix for the next interleaving the embodiment of FIG. 3; and FIG. 5 the entry layout plan of error correction composite bytes in the matrix for the next interleaving stage of another embodiment of FIG. 3.

DETAILED DESCRIPTION OF THE INVENTION

The present invention utilizes multiple stage matrix interleaving to disburse bits adjacently disposed in each byte of a digital information bit stream by a distance greater than that possible with conventional single stage matrix interleaving. Of course, each byte in the digital information bit stream usually includes bits of error correction code. Conventionally, the matrix presents individual bit locations in rows and columns which are disposed along orthogonal axes. As is well known in the digital arts, the first step of conventional matrix interleaving is to enter the consecutive bytes of the digital information bit stream into the matrix along one axis thereof, either row by row or column by column. Then a reorganized bit stream is outputted from the matrix along the other matrix axis, either row by row or column by column. The adjacently disposed bits in each byte of the digital information bit stream are separated in such reorganized bit stream by a distance equal to the bit capacity of one row or column along the matrix output axis, due to this single stage interleaving.

In one embodiment of the present invention, the consecutive bytes in the digital information bit stream are entered into the matrix along one axis thereof, to initiate a first interleaving stage. However, consecutive composite bytes containing only the bits disposed at identical positions within the bytes of each row or column along the entry axis are then outputted as the reorganized bit stream to complete the first stage of interleaving. The consecutive composite bytes in the reorganized bit stream from the first interleaving stage are then entered into the matrix along one axis thereof, to initiate the next interleaving stage. Then a further reorganized bit stream is outputted from either the rows or columns of the matrix along the other axis thereof to complete the next interleaving stage. Although further interleaving stages could be performed, the bits previously disposed in each byte of the digital information bit stream are separated in the further reorganized bit stream by the distance of the bit capacity for a plurality of rows or columns along the matrix output axis of that next interleaving stage. This plurality is equal to the number of bits in each byte of the digital information bit stream, which is also the number of bits in each composite byte.

In another embodiment of the present invention, empty bit locations are reserved in each row or column along the matrix entry axis when the consecutive bytes of the digital information bit stream are entered therein for the first interleaving stage. Then bits of an error correction code are added to each composite byte that is outputted from this first stage, prior to entering such composite bytes into the matrix for the next interleaving stage. When such composite bytes are entered for the next interleaving stage, the rows or columns along the entry axis are filled by such additional error correction code bits.

Applications for matrix interleaving are abundant in the arts of signal recording and information storage, and the multiple stage matrix interleaving of this invention is appropriate for any of these applications, especially those which involve magnetic and/or optical recording or storage of digital information. One such application is found in interactive video disc systems, wherein analog video information and digital information in the form of textual files, audio, programming for still frame and other modes of operation, and so forth, are processed in a single stream of analog and digital information. Of course, the analog video information is processed for display in a video raster having a large plurality of scan lines and which in present-day systems is stored along the digital information on optical discs for selective replay. When such optical discs are recorded for replication, a video tape recorder (VTR) is utilized to premaster both the analog video information and the digital information in the desired raster scan line format. Because high rates of dropout are encountered with both the optical discs and the magnetic tape of the VTR, the invention can be implemented in the recording process to disburse the adjacently disposed bits in each byte of the digital information, for the recorded bit stream. The distance separating such bits is equal to at least the bit capacity of a plurality of matrix rows or columns along the matrix output axis, with the plurality being equal to the number of adjacently disposed bits in each byte of the digital information.

The multiple stage matrix interleaving of the present invention is implemented in the optical disc recording process with a frame buffer memory matrix to which FIGS. 1 through 5 apply. This memory matrix has a first axis which passes through 484 rows of bit locations and a second axis which passes orthogonally to the first axis, through 376 columns of bit locations. The number of rows and columns in the memory matrix is determined in accordance with the number of video raster scan lines on which the digital information is to be recorded. Consequently, each of the 484 rows corresponds with raster scan line, while each of the 376 columns corresponds with a pixel (picture element for video) location along each raster scan line at which a bit of digital information is to be recorded in each video raster frame.

To start the first interleaving step, the digital information bit stream to be recorded in a video raster frame is entered serially into the columns of the memory matrix along the second axis thereof, referring now to FIG. 1. Each byte of digital information includes 22 bits of which some may be check bits for error correction code. In FIG. 1, the bit positions within any byte are designated by consecutive letters of the alphabet from A through V, while the consecutive bytes in the digital information bit stream are arranged consecutively in each column, where they are designated by consecutive subnumbers 0 through 21 in column 0, 22 through 43 in column 1, 44 through 65 in column 2, and so forth. Then composite bytes containing only bits of each column are outputted from each column to complete the first stage of interleaving.

To start the next stage of interleaving, the composite bytes are entered serially into the columns of the memory matrix along said second axis, referring now to FIG. 2. In each column the composite bytes are arranged consecutively and designated by consecutive letters of the alphabet, while the individual bits of each such composite byte are identified with consecutive subnumbers, such as 0 through 21 in column 0, 22 through 43 in column 1, 44 through 65 in column 2, and so forth. Then bits are outputted serially from along the rows of the first matrix axis in a reorganized bit stream with the adjacently disposed bits from each byte of the digital information separated therein by a distance equal to the bit capacity of 22 matrix rows. Although this distance has been found to be quite adequate for assuring the integrity of the digital information for even the most critical computer applications, the reorganized bit stream derived from this next stage of interleaving could be interleaved further in accordance with the present invention, if so desired.

When the bytes of the digital information include check bits of an error correction code, the performance of that error correction code can be enhanced by applying that code to the composite bytes after the first interleaving stage. If such enhanced error correction code performance is desired, each byte of digital information to be recorded in each video raster frame would be error corrected before any interleaving stages are performed. The well-known Hamming Code will be utilized in the following explanation, which occupies 6 to 22 bits in each byte of the digital information. To start the first interleaving stage of the present invention, the error corrected bytes of the digital information to be recorded in each video raster frame is entered serially into the columns of the memory matrix along the second axis thereof, referring now to FIG. 3. However, only 16 bytes of 22 bits each are entered in each column, which reserves empty bit locations in each column for 6 bytes of 22 bits each. In FIG. 3, the bit positions within any bytes are identified by consecutive letters of the alphabet from A through while V the consecutive bytes in the digital information bit stream are arranged consecutively in each column of the matrix, wherein they are identified by consecutive subnumbers with bytes 0 through 15 being disposed in column 0, bytes 16 through 31 being disposed in column 1, bytes 32 through 47 being disposed in column 2, and so forth. Then composite bytes containing only bits from identical positions within the consecutive bytes of each column are outputted from each column to complete the first stage of interleaving. Because only 16 bytes of 22 bits each were entered in each column, 22 bytes of 16 bits each are outputted from each column to allow for each column to be filled by such composite bytes after 6 check bits are added to each composite byte. Then prior to entering the composite bytes into the matrix for the next interleaving stage, the 6 bits of the Hamming error correction code are applied to each of the composite bytes which are each thereby expanded to 22 bits.

To start the next interleaving stage, the expanded composite bytes are entered consecutively into the matrix columns from which they were outputted at the completion of the first interleaving stage, as illustrated in FIG. 4. Because of their expanded format, the 22 composite bytes of 22 bits each fill each matrix column, wherein they are identified by consecutive letters of the alphabet, A through V, which are assigned to the first 16 bits thereof, with the last 6 bits thereof each being identified by "CB" for check bit. The individual bits of the bytes in each column are identified by consecutive numeric subscripts, with the first 16 bits of each byte having subscripts 0 through 15 in column 0, 16 through 31 in column 1, 32 through 47 in column 2, and so forth, with the last 6 bits of each byte having subscripts 1 through 6 in all columns. Then bits are outputted serially from along the rows of the first matrix axis in a reorganized bit stream, with the adjacently disposed bits from each new composite bytes of the digital information separated therein by a distance equal to the bit capacity of 22 matrix rows. Therefore, the error correction coding that is applied to the composite bytes between the interleaving stages does nothing to increase the distance by which adjacently disposed bits from each byte of the digital information are separated, but rather enhances the performance of the error correction code by providing additional level of error correction for all bits of composite bytes from digital data stream.

The adjacently disposed bits from each byte of the digital information bit stream can be separated in the reorganized bit stream by a distance equal to the bit capacity of any plurality of rows or columns, in one preferred embodiment of the present invention. A read-shift-write operation is one convenient technique for determining the plurality of the row or column separation. With this technique the composite bytes are concurrently read out from the memory matrix during a first interleaving stage and written back into the memory matrix during a second interleaving stage. The plurality of the row or column separation is determined by the bit spacing that exists between the identical bit positions of the successive composite bytes read out from the first interleaving stage. In FIG. 3, for example, if successive composite bytes are read out from bit positions A, C, E....Q, S, U....B, D, F....R, T, V, and so on, the plurality of the row or column separation is equal to two. As another example regarding FIG. 3, if successive composite bytes are read out from bit positions A, D, G....P, S, V....B, E, H....N, Q, T, and so on, the plurality of the row or column separation is equal to three. Then, when each composite byte is written into the second interleaving stage, the bit positions thereof are shifted to those previously occupied by the successive composite byte thereto in the first interleaving stage, except for the final composite byte in each row or column which is written into the bit positions previously occupied by the first composite byte in that row or column.

Regardless of what plurality of row or column separation is utilized, the error correction code can be applied to the composite bytes between the interleaving stages. Of course, empty bit locations must be reserved in the memory matrix during the first interleaving stage for the check bits of the error correction code to be written into the memory matrix during the second interleaving stage. Furthermore, the read-shift-write operation can be utilized where only a single row or column separation is desired. A specific embodiment having these variations will now be explained using the entry layout plans of composite bytes illustrated in FIGS. 3 and 5. To start the first interleaving stage, bytes of the digital information to be recorded in each video raster frame are entered into the columns of the memory matrix along the second axis thereof, as illustrated in FIG. 3. As before, only 16 bytes of 22 bits each are entered in each column which reserves empty bit locations in each column for 6 bytes of 22 bits each. Of course, the bytes and the bit positions thereof are identified using the same alphanumeric designations that were explained previously. Successive composite bytes are then read out from the first interleaving stage with 22 bits interleaving factor between the identical positions thereof. Prior to entering the composite bytes into the memory matrix for the second interleaving stage, 6 bits of error correction code are applied to each of the composite bytes which are each expanded thereby. To start the second interleaving stage, each expanded composite byte bits are written back into the memory matrix at the identical bit positions from which the succeeding composite byte bits thereto were previously read out from the first interleaving stage except that the last bits in each composite byte in each column or row is written into the identical bit positions from which the first bit in each composite byte was previously read out, as illustrated in FIG. 5. The individual composite bytes contain the bits of a single numerical designator and from first to last are identified by consecutive letters of the alphabet B through A, to illustrate that the successive identical bit positions thereof can have any order within the scope of the present invention. The individual composite bytes in each column are identified by consecutive numeric subscripts 0 through 15 in column 0, 16 through 31 in column 1, 32 through 47 in column 2, and so forth. The check bits of each composite byte are written into the empty bit locations in each column, separated by a distance equal to the bit capacity of 22 matrix rows and are identified by CB for each check bit, with numeric subscripts 1 through 6 and alphabetical subscripts V through A in each column. CBIA to CBGA represent the 6 check bits generated from A0-A15. CBIB to CBGB are the same for bits B0-B15 and so on with bits V1-V15. Of course, bits are outputted serially from along the rows of the first matrix axis in a reorganized bit stream with the adjacently disposed bits from each byte of the digital information bit stream being separated therein by a distance equal to the bit capacity of one matrix row.

Of course, those skilled in the art of signal recording and/or information storage will appreciate without further explanation that the reorganized bit stream which results from the interleaving process of the present invention would be directed to a recording or storage device, such as the previously mentioned VTR. In that recording or storage device, dropout will have no greater effect on the information contained in the bit stream than does random or single bit error, due to the wide separation that is attainable therein between adjacently disposed bits in each byte of the digital information. It will also be observed that the physical distance between data bits within same composite byte is not increased by the second interleaving stage, but that additional error correction capability is added with increased distance between logical bits. Also, conventional hardware is readily available for the implementation of all the invention embodiments and many different arrangements of such hardware can be devised to accomplish such implementation. Furthermore, when the reorganinzed bit stream is played back from the recording or storage medium, such as the magnetic tape in the previously mentioned VTR, mirror image processing of the previously discussed interleaving will be necessary to retrieve the digital information therefrom.

While the present invention has been described in connection with exemplary embodiments thereof, it will be understood that many modifications will be apparent to those of ordinary skill in the art, and that this application is intended to cover any adaptations or variations thereof. Therefore, it is manifestly intended that this invention be only limited by the claims and the equivalents thereof.

What is claimed is:

1. A method for disbursing the adjacently disposed bits in each byte of a digital information bit stream within a reorganized bit stream by multiple stage interleaving of said digital information bit stream through a matrix having either columns or rows of bit locations disposed along a first axis passing therethrough and either rows or columns of bit locations disposed along a second axis passing therethrough orthogonally to said first axis, comprising at least two stages of interleaving with the following steps:
   (a) entering consecutive bytes of said digital information bit stream into said columns or rows of said matrix along said first axis to start interleaving stage;
   (b) outputting consecutive composite bytes each containing only bits from identical positions within said consecutive bytes of said digital information bit stream entered in each column or row along said first axis during step a) to complete said first interleaving stage;
   (c) entering said consecutive composite bytes into said columns or rows of said matrix along one of said first or second axes to start said second interleaving stage; and
   (d) outputting bits in said reorganized bit stream serially from along another axis with the adjacently disposed bits in each byte of said digital information bit stream separated therein by a distance equal to the bit capacity of a plurality of rows or columns along said another axis.

2. The method of claim 1 wherein steps (b) and (c) are performed concurrently with said bits for successive composite bytes being outputted during step (b) from said identical bit positions which are separated in said consecutive bytes of said digital information bit stream by at least one bit position and each composite byte being entered into said columns or rows along said first axis during step (c) at said identical bit positions from which said succeeding composite byte is outputted during step (b), except said final composite byte outputted from each said column or row during step (b) is entered during step (c) at said identical bit positions from which said first composite byte is outputted from that said column or row during step (b), with said plurality of rows or columns separating adjacently disposed bits in each byte or said digital information bit stream being equal to said number of bit positions separating said successive composite bytes outputted during step (b).

3. The method of claim 1 wherein said consecutive composite bytes are entered into said columns or rows along said first axis during step (c) and bits are outputted from along said second axis during step (d) with said plurality of columns or rows therealong separating the adjacently disposed bits in each byte of said digital information bit stream being equal to the number of adjacently disposed bits in each said byte of said digital information bit stream.

4. The method of claim 1 wherein empty bit locations in each row or column of said matrix along said first axis are reserved when entering said consecutive bytes of said digital information bit streams during step (a) and prior to entering said composite bytes into said columns or rows of said matrix along said first axis during step (c), a step is added for including check bits of an error correction code in said composite bytes, and said empty bit locations reserved during step (a) are filled when entering said error corrected composite bytes into said matrix during step (c) due to the check bits which are included in said composite bytes during said added step.

5. The method of claim 4 wherein each byte of said digital information bit stream includes check bits of said error correction code.

6. The method of claim 4 wherein step (b), said added step, and step (c) are performed concurrently with said bits for successive composite bytes being outputted during step (b) from said identical bit positions which are separated in said consecutive bytes of said digital information bit stream by at least one bit position and after said added step, each composite byte is entered into said columns or rows along said first axis during step (c) at said identical bit positions from which said succeeding composite byte is outputted during step (b) except said final composite byte outputted from each said column or row during step (b) during step (c) at said identical bit positions from which said first composite byte is outputted from that said column or row during step (b), with said plurality of rows or columns separating adjacently disposed bits in each byte or said digital information bit stream being equal to said number of bit positions separating said successive composite bytes outputted during step (b).

7. The method of claim 4 wherein consecutive composite bytes are entered into said columns or rows along said first axis during step (c) and bits are outputted from along said second axis during step (d) with said plurality of columns or rows therealong separating the adjacently disposed bits in each byte of said digital information bit stream being equal to the number of adjacently disposed bits in each said byte of said digital information bit stream.

8. A method for organizing the recording format of adjacently disposed bits in each byte of a digital information bit stream within a reorganized bit stream by multiple stage interleaving of said digital information bit stream which passes from an error correction code generator to a video tape recorder through a frame buffer memory matrix having either columns or rows of bit storage locations disposed along a first axis passing therethrough and either rows or columns of bit storage locations disposed along a first axis passing therethrough and either rows or columns of bit storage locations disposed along a second axis passing therethrough orthogonally to said first axis, and for applying error correction code between interleaving stages, including at least two stages of interleaving and comprising the following steps:

(a) storing consecutive bytes of said digital information bit stream in said columns or rows of said memory matrix along said first axis while reserving empty bit locations in each such column or row, to start said first interleaving stage;

(b) rearing out consecutive composite bytes each containing only bits from identical positions within said consecutive bytes of said digital information bit stream stored in each column or row along said first axis during step a), to complete said first interleaving stage;

(c) adding check bits of an error correction code to said composite bytes in said error correction code generator;

(d) storing said consecutive composite bytes in said columns or rows of said memory matrix along said first axis with said empty bit locations that were reserved during step a) being filled due to said check bits which are added to said composite bytes during step c), to start said second interleaving stage; and (e) reading out bits in said reorganized bit stream from said columns or rows of said memory matrix along said second axis to said video tape recorder for entry on sequential faster scan lines, said reorganized bit stream having the adjacently disposed bits in each byte of said digital information bit stream separated therein by a distance equal to the bit capacity of a plurality of rows or columns along said second axis 9. The method of claim 8 wherein said steps (b), (c) and (d) are performed concurrently with said bits for successive composite bytes being outputted during step (b) from said identical bit positions which are separated in said consecutive bytes of said digital information bit stream by at least one bit position and after step (c), each composite byte is entered into said columns or rows along said first axis during step (d) at said identical bit positions from which said succeeding composite byte is outputted during step (b), except said final composite byte outputted from each said column or row during step (b) is entered during step (d) at said identical bit positions from which said first composite byte is outputted from that said column or row during step (b), with said plurality of rows or columns separating adjacently disposed bits in each byte or said digital information bit stream being equal to said number of bit positions separating said successive composite bytes outputted during step (b).

10. The method of claim 8 wherein said consecutive composite bytes are entered into said columns or rows along said first axis during step (d) and bits are outputted from along said second axis during step (e) with said plurality of columns or rows therealong separating the adjacently disposed bits in each byte of said digital information bit stream being equal to the number of adjacently disposed bits in each said byte of said digital information bit stream.

11. A method for reorganizing the recording format of adjacently disposed bits in each byte of a digital information bit stream within a reorganized bit stream by multiple stage interleaving of said digital information bit stream which passes from an error correction code generator to a video tape recorded through a frame buffer memory matrix having either columns or rows of bit storage location disposed along a first axis passing therethrough and either rows or columns of bit storage locations disposed along a second axis passing therethrough orthogonally to said first axis, and for applying error correction code between interleaving stages, including at least two stages of interleaving and comprising the following steps:

(a) storing consecutive bytes of said digital information bit stream in said columns or rows of said memory matrix along said first axis while reserving empty bit locations in each such column or row, to start a first interleaving stage;

(b) reading out consecutive composite bytes each containing only bits from identical positions within said consecutive bytes of said digital information bit stream stored in each column or row along said first axis during step (a), to complete said first interleaving stage;

(c) adding check bits of an error correction code to said composite bytes in said error correction code generator;

(d) storing said consecutive composite bytes in said columns or rows of said memory matrix along said first axis at the same bit locations from where they were read out during step (b), with said check bits added to each said composite byte during step (c) being written into said empty bit locations that were reserved during step (a) separated by a distance equal to one bit less than the number of bits in each said composite byte, to start a second interleaving stage; and (e) reading out bits in said reorganized bit stream from said columns or rows of said memory matrix along said second axis to said video tape recorder for entry on sequential raster scan lines.

12. The method of claim 11 wherein steps (b), (c) and (d) are performed concurrently with said bits for successive composite bytes being outputted during step (b) from said identical bit positions which are sequential in said consecutive bytes of said digital information bit stream and after step (c), each composite byte is entered into said columns or rows along said first axis during step (d) at said identical bit positions from which said succeeding composite byte is outputted during step (b), except a final composite byte outputted frame each said column or row during step (b) is entered during step (d) at said identical bit positions from which said first composite byte is outputted from that said column or row during step (b).

* * * * *

UNITED STATES PATENT AND TRADEMARK OFFICE
CERTIFICATE OF CORRECTION

PATENT NO. : 4,802,170
DATED : JANUARY 31, 1989
INVENTOR(S) : LORNE TROTTIER

It is certified that error appears in the above-identified patent and that said Letters Patent is hereby corrected as shown below:

In the Claims:

Claim 8, line 57, "rearing", should read -- reading --.

Signed and Sealed this

Thirtieth Day of April, 1991

Attest:

HARRY F. MANBECK, JR.

Attesting Officer

Commissioner of Patents and Trademarks